United States Patent
Bartley et al.

(10) Patent No.: US 6,956,383 B2
(45) Date of Patent: Oct. 18, 2005

(54) METHOD AND APPARATUS FOR IMPLEMENTING AUTOMATED ELECTRONIC PACKAGE TRANSMISSION LINE CHARACTERISTIC IMPEDANCE VERIFICATION

(75) Inventors: Gerald Keith Bartley, Rochester, MN (US); Paul Eric Dahlen, Rochester, MN (US); Philip Raymond Germann, Rochester, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 10/712,742

(22) Filed: Nov. 13, 2003

(65) Prior Publication Data

US 2005/0104602 A1     May 19, 2005

(51) Int. Cl.[7] .............................................. G01R 27/28
(52) U.S. Cl. ..................................... 324/656; 324/642
(58) Field of Search ................................ 324/656, 637, 324/642, 539, 542

(56) References Cited

U.S. PATENT DOCUMENTS

| | | | | |
|---|---|---|---|---|
| 5,528,152 A | * | 6/1996 | Hinoshita et al. | 324/539 |
| 5,636,147 A | * | 6/1997 | Tolmie et al. | 703/5 |
| 6,532,215 B1 | * | 3/2003 | Muntz | 370/242 |
| 6,593,770 B2 | * | 7/2003 | Hernandez-Marti | 326/30 |

* cited by examiner

*Primary Examiner*—Anjan Deb
*Assistant Examiner*—Timothy J. Dole
(74) *Attorney, Agent, or Firm*—Joan Pennington

(57) ABSTRACT

A method and apparatus are provided for implementing automated electronic package transmission line characteristic impedance verification. A sinusoidal voltage source is coupled to a transmission line test structure for generating a selected frequency. Impedance measuring circuitry is coupled to the transmission line test structure for measuring an input impedance with an open-circuit termination and a short-circuit termination. Characteristic impedance calculation circuitry is coupled to the impedance measuring circuitry receiving the input impedance measured values for the open-circuit termination and the short-circuit termination for calculating characteristic impedance. Logic circuitry is coupled to the characteristic impedance calculation circuitry for comparing the calculated characteristic impedance with threshold values for verifying acceptable electronic package transmission line characteristic impedance.

15 Claims, 5 Drawing Sheets

METHOD AND APPARATUS FOR IMPLEMENTING AUTOMATED ELECTRONIC PACKAGE TRANSMISSION LINE CHARACTERISTIC IMPEDANCE VERIFICATION

FIELD OF THE INVENTION

The present invention relates to a method and apparatus for implementing automated electronic package transmission line characteristic impedance verification.

DESCRIPTION OF THE RELATED ART

For the design of transmission lines in electronic packages, one of the most critical parameters to control is the characteristic impedance $Z_O$. The characteristic impedance of transmission lines in electronic packages with high interconnect densities is most commonly measured using time-domain techniques such as time-domain reflectometry (TDR). TDR techniques assume a particular time-domain input excitation waveform, namely, a fast edge transition with a known rise time.

FIG. 1 illustrates the setup for such TDR characteristic impedance measurement techniques. The characteristic impedance is then calculated by analyzing the waveform at the near-end of the transmission line being tested.

The disadvantages of this approach include the following:

(A) Complex and expensive electronic test instrumentation is required to generate and measure the input excitation waveform.

(B) Analysis of the transmission line's near-end waveform is relatively complex and requires subjective analytic interpretation, and thus is often not convenient for a production manufacturing environment.

(C) The time-domain input signal has multiple frequency components, leading to an inherent ambiguity in the frequency at which the characteristic impedance measurement was performed.

Other known techniques for measuring characteristic impedance of a transmission line use a frequency-domain approach, featuring an excitation waveform with only a single sinusoidal frequency component. Such techniques have the advantage of measuring the characteristic impedance at one particular frequency of interest.

FIGS. 2A and 2B illustrate the setup for one such frequency-domain technique that involves two measurements of the input impedance of a transmission line. The first measurement is done with the transmission line terminated in an open circuit as shown in FIG. 2A. The second measurement is done with the transmission line terminated in a short circuit as shown in FIG. 2B.

Typically, the technique illustrated in FIGS. 2A and 2B has been applied in a laboratory environment to discrete transmission line structures, such as coaxial cables, and not in a production test environment to electronic packages with high interconnect densities, i.e., those with multiple transmission line structures.

A need exists for an effective mechanism for implementing automated electronic package transmission line characteristic impedance verification.

SUMMARY OF THE INVENTION

A principal object of the present invention is to provide a method and apparatus for implementing automated electronic package transmission line characteristic impedance verification. Other important objects of the present invention are to provide such method and apparatus for implementing automated electronic package transmission line characteristic impedance verification substantially without negative effect and that overcome many of the disadvantages of prior art arrangements.

In brief, a method and apparatus are provided for implementing automated electronic package transmission line characteristic impedance verification. A sinusoidal voltage source is coupled to a transmission line test structure for generating a selected frequency. Impedance measuring circuitry is coupled to the transmission line test structure for measuring an input impedance with an open-circuit termination and a short-circuit termination. Characteristic impedance calculation circuitry is coupled to the impedance measuring circuitry receiving the input impedance measured values for the open-circuit termination and the short-circuit termination for calculating characteristic impedance. Logic circuitry is coupled to the characteristic impedance calculation circuitry for comparing the calculated characteristic impedance with threshold values for verifying acceptable electronic package transmission line characteristic impedance.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, a method is provided for verifying an electronic package's characteristic impedance through the utilization of a single electronic integrated circuit device, thereby making its measurement very repeatable and easily interpretable in a production manufacturing environment.

Figure 3:
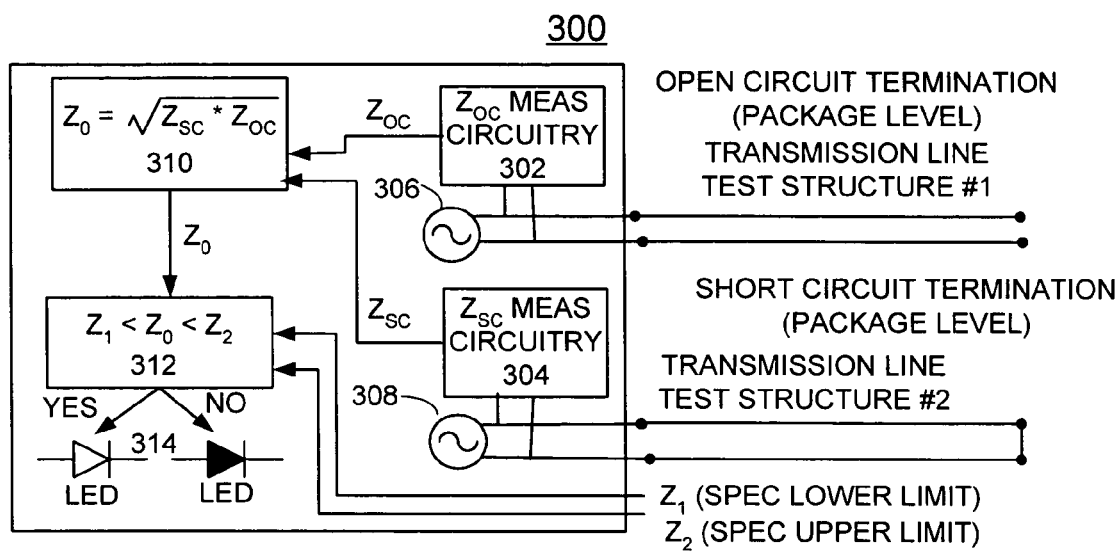
FIGS. 3 and 4 are schematic diagrams illustrating alternative apparatus for implementing automated electronic package transmission line characteristic impedance verification in accordance with the preferred embodiments.
Figure 4:
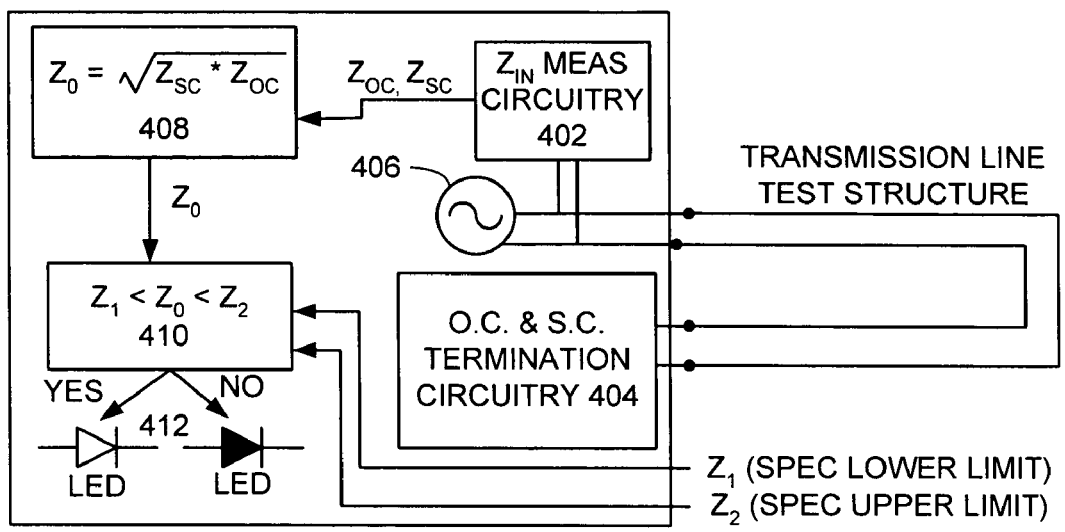

Having reference now to the drawings, two embodiments of the invention are provided and illustrated in FIGS. 3 and 4. In FIG. 3, there is shown apparatus for implementing automated electronic package transmission line characteristic impedance verification generally designated by the reference character 300 in accordance with one preferred embodiment. In FIG. 4, there is shown apparatus for implementing automated electronic package transmission line characteristic impedance verification generally designated by the reference character 400 in accordance with another preferred embodiment. In both embodiments 300, 400, one or more test traces are built into the electronic package design and then internal circuitry of an electronic integrated circuit respectively defining apparatus 300 or apparatus 400 analyzes these traces to actively determine the characteristic impedance.

Figure 2A:
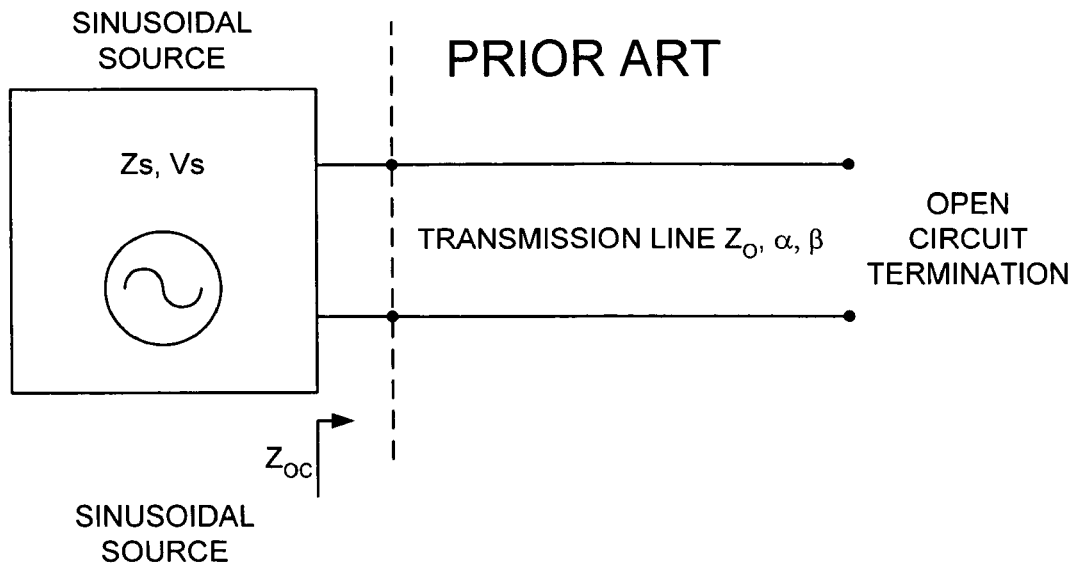
FIGS. 2A and 2B are diagrams illustrating prior art frequency-domain characteristic impedance measurement technique.
Figure 2B:
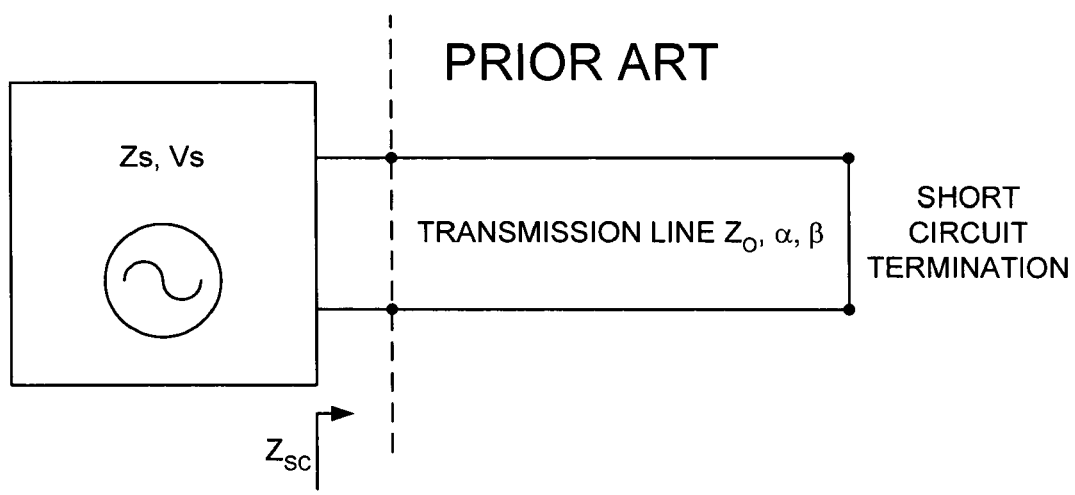

Both apparatus 300 and apparatus 400 consolidate the various electronic components required for the method illustrated in FIGS. 2A and 2B into a single integrated circuit device. Both apparatus 300 and apparatus 400 allow electronic package transmission line characteristic impedance verification in an automated fashion and in a production or manufacturing environment.

Apparatus 300 has the advantage of a simpler integrated circuit (IC) design, at the expense of possible losses in accuracy due to variation between the two required transmission line test structures, implemented at the package level with open-circuit termination and short-circuit terminations, respectively. Apparatus 400 has the advantage of greater accuracy due to the requirement of only a single transmission line test structure, at the possible expense of a more complicated IC design due to the addition of circuitry for providing the required open-circuit termination and short-circuit termination, in a sequential manner and the like.

Apparatus 300 of the preferred embodiment consolidates electronic components into an integrated circuit including an open circuit ($Z_{OC}$) impedance measuring circuitry 302, a short circuit ($Z_{SC}$) impedance measuring circuitry 304, and a respective associated sinusoidal voltage source 306, 308. Apparatus 300 includes a characteristic impedance calculation block 310 coupled to the impedance measuring circuitry 302, 304 receiving the input impedance measured values $Z_{OC}$ and $Z_{SC}$ for calculating characteristic impedance $Z_O$.

From transmission line theory, it is known that for a given line of length 1.

$$Z_{OC} = Z_O \coth(\alpha + j\beta) * l, \text{ and}$$

$$Z_{SC} = Z_O \tanh(\alpha + j\beta) * l$$

Then the characteristic impedance $Z_O$, is calculated from the measured values of input impedance measured values $Z_{OC}$ and $Z_{SC}$, as follows:

$$Z_O = (Z_{SC} \cdot Z_{OC})^{1/2}$$

One significant advantage of this method for calculating the characteristic impedance $Z_O$ at characteristic impedance calculation block 310 of apparatus 300 is that it inherently accounts for transmission line attenuation and dispersion mechanisms, i.e., lossy lines are automatically covered.

Apparatus 300 includes logic circuitry 312 coupled to the characteristic impedance calculation block 310 receiving the calculated characteristic impedance $Z_O$ and control tolerances $Z_1$, $Z_2$ representing the limits of the characteristic impedance specification are required inputs. A simple pass/fail criteria, represented by $Z_1 < Z_O < Z_2$, is implemented by logic circuitry 312 and the pass/fail results are displayed by a display 314, which allows any operator on the production floor to easily verify the particular package meets the specification. For example, display 314 is implemented by pair of light emitting diodes (LEDs) to display the pass or fail result.

Referring to FIG. 4, apparatus 400 includes an impedance measuring circuitry 402 coupled to an open circuit and short circuit termination circuitry 404, and a sinusoidal voltage source 406. Apparatus 400 includes a characteristic impedance calculation block 408 coupled to the impedance measuring circuitry 402 receiving the input impedance measured values $Z_{OC}$ and $Z_{SC}$ for calculating characteristic impedance $Z_O$. Apparatus 400 includes logic circuitry 410 coupled to the characteristic impedance calculation block 408 receiving the calculated characteristic impedance $Z_O$ and control tolerances $Z_1$, $Z_2$ representing the limits of the characteristic impedance specification are required inputs. A simple pass/fail criteria, represented by $Z_1 < Z_O < Z_2$, similarly is implemented by logic circuitry 410 and the pass/fail results are displayed by a display 412.

Figure 5:
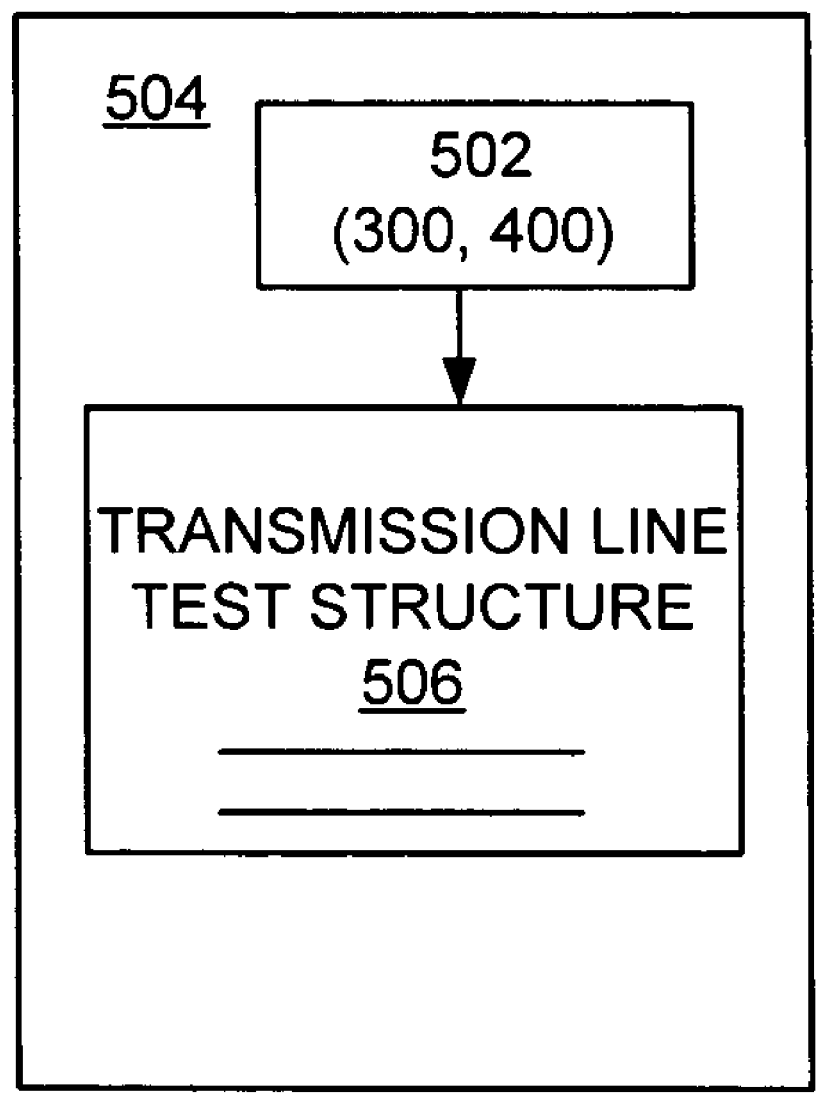
FIG. 5 illustrates an electronic unit in accordance with a preferred embodiment of the apparatus of FIGS. 3 and 4.

Referring to FIG. 5, there is shown an electronic unit generally designated by the reference character 500 in accordance with a preferred embodiment. Electronic unit includes a single integrated circuit device 502 and a card or multi-chip module 504. In apparatus 300, the single integrated circuit device 502 includes the impedance measuring circuitry 302, 304; the sinusoidal voltage sources 306, 308; the characteristic impedance calculation block 310, logic circuitry 312, and display 314. In apparatus 400, the single integrated circuit device 502 includes the impedance measuring circuitry 402; the open circuit and short circuit termination circuitry 404, sinusoidal voltage source 406, characteristic impedance calculation block 408, logic circuitry 410, and display 412. A transmission line test structure 506 representing conductors on the card or multi-chip module 504 respectively defines the transmission line test structures #1, #2 of FIG. 3 or the single transmission line test structure of FIG. 4. The single integrated circuit device 502 of apparatus 300 and of apparatus 400 is located on or is included in the card or multi-chip module 504 for the respective transmission line test structures.

Figure 1:
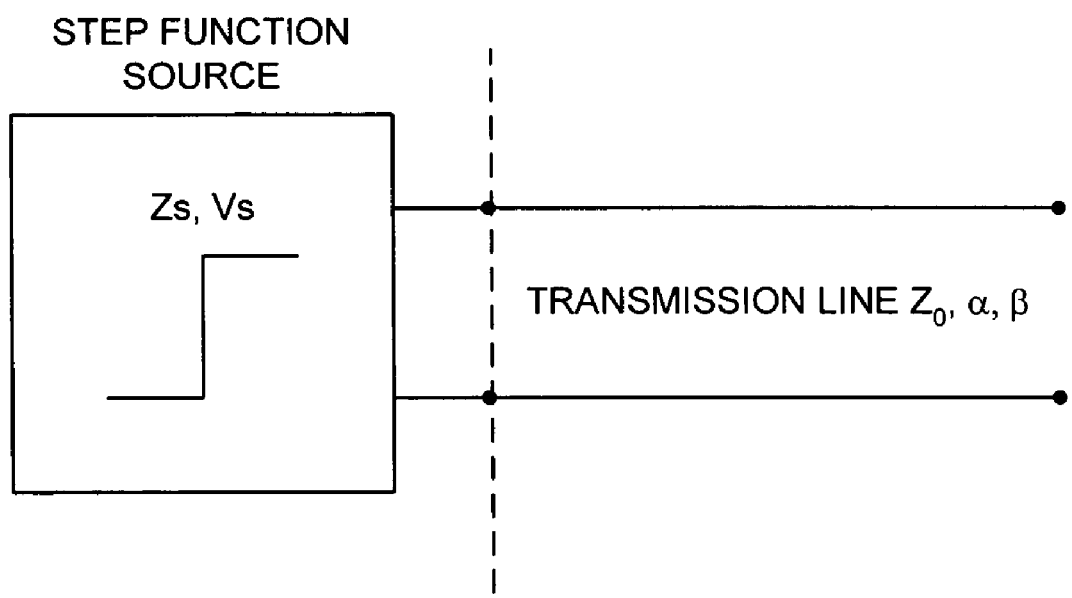
FIG. 1 is a schematic diagram illustrating a prior art time-domain reflectometry (TDR) characteristic impedance measurement technique.

Several advantages of the method of the invention implemented with apparatus 300 and apparatus 400 over the commonly used time-domain method of FIG. 1 include the following:

(A) Expensive test instrumentation is no longer needed on the production floor to verify that transmission lines meet the required characteristic impedance requirement.

(B) Any test inconsistencies between equipment and equipment operators are eliminated, as well as subjective analysis of the results.

(C) The characteristic impedance can be measured and validated at single, discrete frequency(ies) of interest, i.e., the ambiguities in frequency content inherent in time-domain methods are eliminated.

While the present invention has been described with reference to the details of the embodiments of the invention shown in the drawing, these details are not intended to limit the scope of the invention as claimed in the appended claims.

What is claimed is:

1. A method for implementing automated electronic package transmission line characteristic impedance verification comprising the steps of:

providing a transmission line test structure, said transmission line test structure representing conductors on a card, providing a single integrated circuit device disposed on said card; said single integrated circuit device implementing automated electronic package transmission line characteristic impedance verification steps including;

generating a selected frequency coupled to said transmission line test structure;

measuring an input impedance with an open-circuit termination and a short-circuit termination on said transmission line test structure;

using said input impedance measured value for said open-circuit termination and said short-circuit termination, calculating characteristic impedance; and comparing said calculated characteristic impedance with threshold values for verifying acceptable electronic package transmission line characteristic impedance.

2. A method for implementing automated electronic package transmission line characteristic impedance verification as recited in claim 1 includes the steps of providing a pair of said transmission line test structures respectively implemented at a package level with a open-circuit termination and a short-circuit termination.

3. A method for implementing automated electronic package transmission line characteristic impedance verification as recited in claim 2 wherein the steps of measuring said input impedance with said open-circuit termination and said short-circuit termination for said transmission line test structure includes the steps of providing said single integrated circuit device with open-circuit impedance measuring circuitry coupled to one of said pair of said transmission line test structures; and providing said single integrated circuit device with short-circuit impedance measuring circuitry coupled to another of said pair of said transmission line test structures.

4. A method for implementing automated electronic package transmission line characteristic impedance verification as recited in claim 1 includes the steps of providing a single transmission line test structure implemented at a package level and providing said single integrated circuit device with open-circuit and short-circuit termination circuitry coupled to said single transmission line test structure at said package level.

5. A method for implementing automated electronic package transmission line characteristic impedance verification as recited in claim 4 wherein the steps of measuring said input impedance with said open-circuit termination and said short-circuit termination for said transmission line test structure includes the steps of sequentially providing an open-circuit termination and a short-circuit termination to said single transmission line test structure utilizing said open-circuit and short-circuit termination circuitry.

6. A method for implementing automated electronic package transmission line characteristic impedance verification as recited in claim 1 includes the steps of displaying a pass or fail result responsive to said compared values.

7. Apparatus for implementing automated electronic package transmission line characteristic impedance verification comprising:
a sinusoidal voltage source coupled to a transmission line test structure for generating a selected frequency;
impedance measuring circuitry coupled to said transmission line test structure for measuring an input impedance for an open-circuit termination and a short-circuit termination;
characteristic impedance calculation circuitry coupled to said impedance measuring circuitry for receiving said input impedance measured values with said open-circuit termination and said short-circuit termination for calculating characteristic impedance;
logic circuitry coupled to said characteristic impedance calculation circuitry for comparing said calculated characteristic impedance with threshold values for verifying acceptable electronic package transmission line characteristic impedance;
said sinusoidal voltage source, said impedance measuring circuitry, said characteristic impedance calculation circuitry, and said logic circuitry being implemented by a single integrated circuit device; and
said transmission line test structure represents conductors on a card and said single integrated circuit device is disposed on said card.

8. Apparatus for implementing automated electronic package transmission line characteristic impedance verification as recited in claim 7 wherein said transmission line test structure includes a pair of transmission line test structures respectively implemented at a package level with a open-circuit termination and a short-circuit termination.

9. Apparatus for implementing automated electronic package transmission line characteristic impedance verification as recited in claim 8 wherein said impedance measuring circuitry includes an open-circuit impedance measuring circuitry coupled to one of said pair of transmission line test structures; and a short-circuit impedance measuring circuitry coupled to another of said pair of transmission line test structures.

10. Apparatus for implementing automated electronic package transmission line characteristic impedance verification as recited in claim 7 wherein said transmission line test structure includes a single transmission line test structure implemented at a package level and an open-circuit and short-circuit termination circuitry coupled to said single transmission line test structure.

11. Apparatus for implementing automated electronic package transmission line characteristic impedance verification as recited in claim 7 includes a display coupled to said logic circuitry for displaying a pass or fail result responsive to said compared values.

12. Apparatus for implementing automated electronic package transmission line characteristic impedance verification as recited in claim 7 wherein said characteristic impedance calculation circuitry calculates said characteristic impedance represented by:

$$Z_O = (Z_{SC} \cdot Z_{OC})^{1/2}$$

where $Z_O$ represents said calculated characteristic impedance and $Z_{OC}$ and $Z_{SC}$ represent said input impedance measured values for said open-circuit termination and said short-circuit termination.

13. Apparatus for implementing automated electronic package transmission line characteristic impedance verification as recited in claim 7 wherein said logic circuitry compares said calculated characteristic impedance with threshold values for verifying acceptable electronic package transmission line characteristic impedance represented by:

$$Z_1 < Z_O < Z_2$$

where $Z_O$ represents said calculated characteristic impedance and $Z_1$, $Z_2$ represent lower and upper threshold values for an electronic package characteristic impedance specification.

14. An electronic unit comprising:
a transmission line test structure; and
a single integrated circuit device for implementing automated electronic package transmission line characteristic impedance verification; said single integrated circuit device including:
a sinusoidal voltage source coupled to said transmission line test structure for generating a selected frequency;
impedance measuring circuitry coupled to said transmission line test structure for measuring an input impedance for an open-circuit termination and a short-circuit termination;
characteristic impedance calculation circuitry coupled to said impedance measuring circuitry for receiving said input impedance measured values with said open-circuit termination and said short-circuit termination for calculating characteristic impedance;
logic circuitry coupled to said characteristic impedance calculation circuitry for comparing said calculated characteristic impedance with threshold values for verifying acceptable electronic package transmission line characteristic impedance; and said transmission line test structure represents conductors on a card and said single integrated circuit device is disposed on said card.

15. An electronic unit comprising:

a transmission line test structure; and a single integrated circuit device for implementing automated electronic package transmission line characteristic impedance verification; said single integrated circuit device including:

a sinusoidal voltage source coupled to said transmission line test structure for generating a selected frequency;

impedance measuring circuitry coupled to said transmission line test structure for measuring an input impedance for an open-circuit termination and a short-circuit termination;

characteristic impedance calculation circuitry coupled to said impedance measuring circuitry for receiving said input impedance measured values with said open-circuit termination and said short-circuit termination for calculating characteristic impedance;

logic circuitry coupled to said characteristic impedance calculation circuitry for comparing said calculated characteristic impedance with threshold values for verifying acceptable electronic package transmission line characteristic impedance; and said transmission line test structure represents conductors on a multi-chip module and said single integrated circuit device is included in said multi-chip module.

* * * * *